United States Patent [19]

Wuthrich et al.

[11] Patent Number: 4,598,337

[45] Date of Patent: Jul. 1, 1986

[54] ELECTRONIC CIRCUIT BOARD FOR A TIMEPIECE

[75] Inventors: Paul Wuthrich; Lyman R. Daigle, both of Watertown; Gerald Cozzolino, Oakville, all of Conn.

[73] Assignee: Timex Corporation, Waterbury, Conn.

[21] Appl. No.: 651,131

[22] Filed: Sep. 17, 1984

[51] Int. Cl.⁴ .............................................. H05K 1/18
[52] U.S. Cl. .................................. 361/401; 361/398; 368/88; 368/318
[58] Field of Search .................. 361/398, 401; 368/88, 368/318

[56] References Cited

U.S. PATENT DOCUMENTS

| | | | |
|---|---|---|---|
| 3,142,783 | 7/1964 | Warren | 361/401 |
| 3,266,125 | 8/1966 | Tobolski | 361/401 X |
| 3,484,534 | 12/1969 | Kilby et al. | 361/401 X |
| 3,792,383 | 2/1974 | Knappenberger | 361/401 X |
| 4,064,552 | 12/1977 | Angelucci et al. | 361/401 X |
| 4,095,412 | 6/1978 | Burke | 361/398 X |
| 4,144,705 | 3/1979 | Iinuma | 368/88 |
| 4,157,007 | 6/1979 | Vennard | 368/88 X |
| 4,241,436 | 12/1980 | Bolzt et al. | 368/318 X |

Primary Examiner—R. R. Kucia
Attorney, Agent, or Firm—William C. Crutcher

[57] ABSTRACT

An electronic circuit board of very thin construction for a wristwatch employs a printed circuit board of insulating material with punched apertures for receiving and locating circuit components, such as capacitors, transistors and integrated circuits, which are of substantially the same thickness as the printed circuit board. A thin metallic conductive backplate is also provided with apertures and with bridging portions supporting the circuit components. Tabs on the backplate or on similar conductive clips for supporting circuit elements may be bent upward and extended through the circuit board apertures for making solder connections to discrete components or to conductive pads on the upper side of the printed circuit board. The backplate includes tabs for other purposes such as holding the backplate to the printed circuit board, making battery connections, providing switch terminals, and retaining the module under spring tension in the case.

13 Claims, 6 Drawing Figures

ELECTRONIC CIRCUIT BOARD FOR A TIMEPIECE

This invention relates to electronic circuit boards for timepieces, and more particularly to an assembly of a printed circuit board and conductive backplate for a wristwatch of very thin construction.

Printed circuit boards, both flexible and rigid, are well known for use in watch construction, exemplary patents being U.S. Pat. Nos. 3,759,031—McCullough, et al; 3,788,999—Buffray; and 3,863,436—Schwartzchild, et al, the latter assigned to the present assignee. The circuit components, such as capacitors, integrated circuits and the like are sometimes wholly or partially recessed in the PCB, but often extend above or below the PCB making a thicker construction and leaving protruding elements liable to be damaged. Other types of watch constructions are known, as in U.S. Pat. Nos. 4,142,287—Grabbe and 4,405,242—Kosaka, et al, wherein a conductive lead frame or similar pattern of conductors is encapsulated in insulating material, having apertures for inserting circuit components and connecting the components to the conductors in various ways, again requiring a fairly thick plastic molding.

Very thin discrete circuit components, such as integrated circuits, transistors and capacitors, are now available, including so-called leadless capacitors, which are of thickness no greater than very thin printed circuit boards. The transistors and integrated circuits are available in unencapsulated form with the silicon substrate exposed. The main problem is to devise ways of supporting and electrically connecting the very thin components to the conductive tracks and pads on the printed circuit board. U.S. Pat. No. 4,143,508—Ohno discloses an electronic circuit block for a timepiece in which discrete components are embedded in recesses extended partially into an insulated member, and wherein connections are made by deposition of a conductive layer on the circuit components at the same level with the surface of the circuit substrate. Inasmuch as the circuit components are only partially embedded, the overall assembly is thicker than it might be if the recess were extended all the way through the insulating member. Partial recesses are also more difficult to make than blanked out apertures.

In U.S. Pat. No. 4,276,629—Matsumura, et al, a thin flexible printed circuit board with apertures is supported on a thicker base metal plate having aligned underlying apertures of greater size than those in the PCB. A discrete component is supported in the PCB by a flange lying on top of a conductive pad surrounding the PCB aperture. The discrete component extends into the larger aperture in the base metal plate. A soldered connection is made between the overlying discrete component flange and the underlying PCB pad, resulting in a thicker connection because of vertically stacked elements.

Constructions are also known in electronic circuit boards, wherein conductive metallic sheets not only perform electrical connections but also perform various mechanical tasks, such as holding one or more components together, retaining the circuit board in the watchcase, or having flexible fingers to provide switch closures. One example of this is seen in U.S. Pat. No. 4,241,439—Skwarek, assigned to the present assignee, wherein a metallic member serves as electrical connector to a printed circuit board, includes flexible spring battery contact member and has an upstanding tab which by means of a solder bead, holds a substrate board to a carrier frame.

It would be desirable to provide a very thin electronic circuit board for a timepiece in which the components could be temporarily held by the circuit board during assembly, easily connected at the circuit board upper surface by soldering, and using very thin stamped members for the board and grounding plate.

Accordingly, one object of the present invention is to provide an improved thin electronic circuit board for a timepiece such as a wristwatch.

Another object of the invention is to provide an electronic circuit board, in which the discrete components are easily assembled and connected.

Yet another object of the invention is to provide a circuit board assembly having a minimum number of component parts, which parts perform multiple electrical and mechanical functions, in order to reduce the cost.

SUMMARY OF THE INVENTION

Briefly stated, the invention comprises an insulated board having apertures extending therethrough for receiving and locating discrete circuit components of substantially the same thickness as the board, the board having conductive tracks and pads on one side adjacent the apertures. A metallic conductive backplate member attached to the other side of the board also has apertures extending therethrough and includes bridging portions for supporting the components in the board apertures. The assembly may also include tabs bent upward from the backplate and extending through the board apertures for making electrical connection to the components and to conductive pads at the upper surface of the insulating board.

DRAWING

The foregoing objects and advantages will be better understood by reference to the following description, taken in connection with the accompanying drawings, in which:

FIG. 1 is a top plan view of the assembled electronic circuit board of the present invention, FIG. 2 is a top plan view of the conductive backplate used in the present invention, FIG. 3 is an enlarged perspective drawing, partly in section, looking in the direction of lines III—III of FIG. 1, FIG. 4 is a similar perspective drawing viewed in the direction of lines IV—IV of FIG. 1, and FIGS. 5 and 6 are cross-sectional elevation views taken along lines V—V and VI—VI respectively of FIG. 1.

DESCRIPTION OF THE PREFERRED EMBODIMENT

Figure 1:
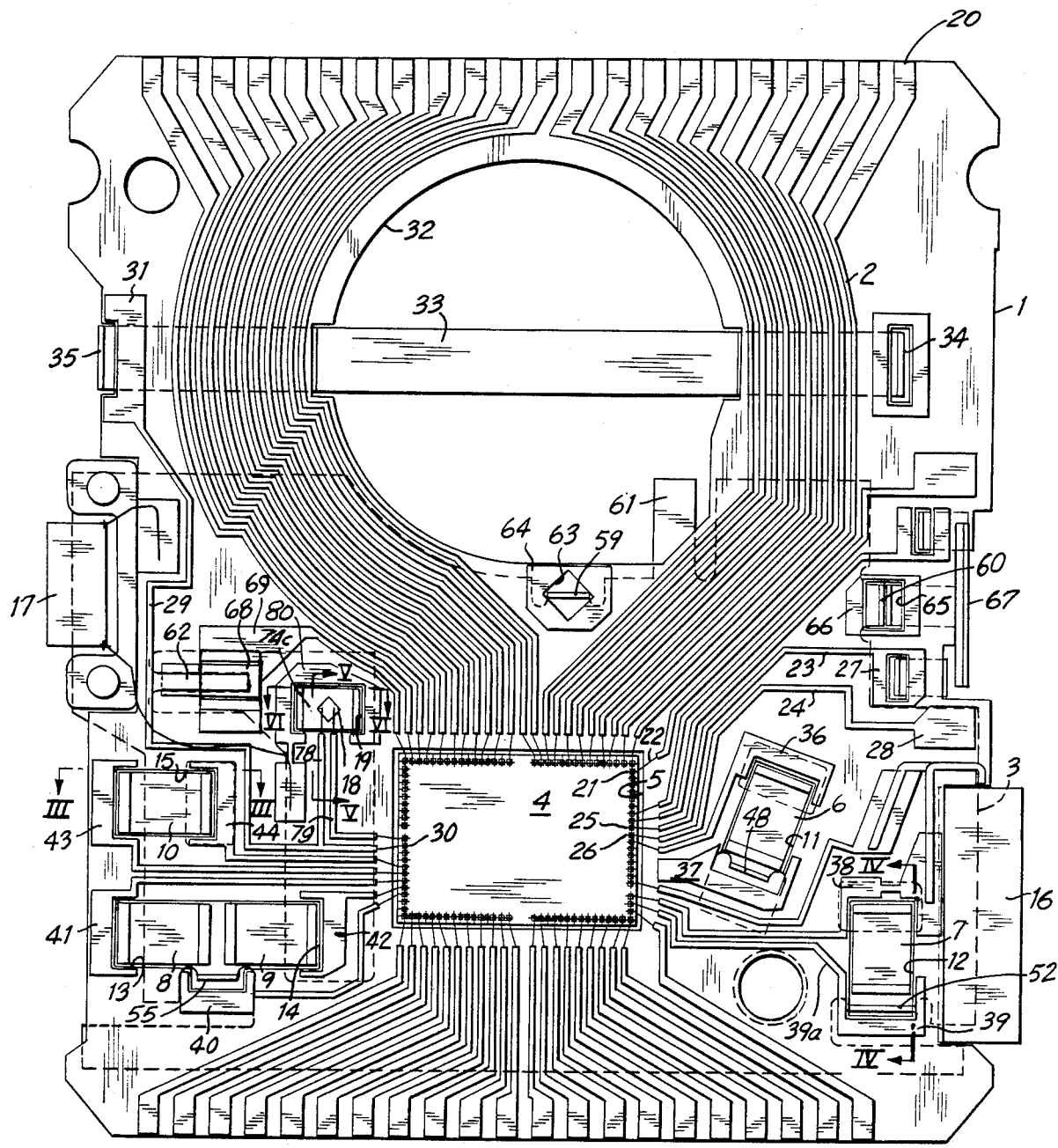

Referring now to FIG. 1 of the drawing, the electronic circuit board comprises an insulated printed circuit board 1 having a conductive track 2 thereon formed by deposition or by etching conductive material off a conductive layer on the upper surface of board 1 in a conventional manner. Immediately underlying board 1 is a thin conductive metallic backplate 3 electrically connected to ground and also shown alone in FIG. 2 of the drawing. The thickness of the insulated board member is only on the order of 0.016 inches and the thickness of the conductive backplate is only on the order of 0.005 inches. Discrete circuit components having a thickness on the order of that of board 1 are located in stamped out apertures in the board and supported by bridging portions of the backplate or special clips, as follows.

An integrated circuit 4 implemented as a microprocessor watch chip designed to perform timekeeping functions is located in aperture 5 extending through board 1. Rather than having the normal insulating encapsulation, integrated circuit 4 is in unencapsulated form with the silicon substrate exposed. This enables it to be much thinner.

Leadless capacitors 6, 7, 8, 9 and 10 are disposed in respective board apertures 11, 12, 13, 14, 15. Apertures 13, 14 are actually connected as one. Other circuit components include a quartz crystal 16 and an inductor 17 for the watch alarm. A transistor 18 for driving the alarm circuit is located in a board aperture 19, and supported by a special spring clip to be further described.

The majority of conductive tracks such as 2 on board 1, terminate on one end in contact terminals such as 20 along opposite edges of the board. Terminals 20 are connected through elastomeric conductive connectors (not shown) to aligned terminals on a conventional liquid crystal display above the board (not shown). The other ends of tracks 2 are connected to driver output pins such as 21 on the integrated circuit 4, by means of wire bond connections 22.

Additional conductive tracks 23, 24 are connected in like manner to input pins 25, 26 on the integrated circuit and terminate in pads 27, 28 to serve as switches operated by an external actuator for setting the time or performing other switching functions. Details of the switching mechanism are disclosed in a copending application of Wuthrich, et al entitled "Crown Setting Switch for Solid State Analog Watch" (PI-1076) filed Sept. 13, 1984, now U.S. Pat. No. 4,536,095 issued Aug. 20, 1985 and assigned to the present assignee.

Power is supplied to the circuit by a button-shaped energy cell (not shown). A conductive track 29 connected between pin 30 and a pad 31 connects one side of the energy cell to the integrated circuit. An aperture 32 in the board accommodates the energy cell. A conductive metallic clip 33 has a portion bridging the board aperture 32 and is secured at opposite ends by upturned tabs 34, 35. Tab 34 and 35 are soldered to the conductive pads on opposite sides of the board. One terminal of the energy cell is supported on and makes electrical contact with the bridging portion of clip 33, thereby connecting it with pin 30. The other terminal of the energy cell makes contact with a resilient finger 61 on backplate 3.

In accordance with the present invention, the leadless capacitors 6 through 10, which are disposed in board recesses 11 through 15, are constructed so that the central portions are insulated and terminate on opposite ends in conductive terminals, which are aligned in the plane of the board. The opposite terminals of capacitor 6 are located adjacent a pad 36 connected by a track to the integrated circuit, and an insulated pad 37. The opposite terminals of capacitor 7 are located adjacent a pad 38 and a pad 39 connected by tracks to the integrated circuit. Capacitor 8 and 9 have an adjacent proximal pair of terminals sharing a pad 40 and have their opposite or distal pair of ends located adjacent pads 41, 42 respectively. Lastly, capacitor 10 has opposite ends located adjacent pads 43, 44. The foregoing conductive pads 38 through 44 are connected by tracks and wire bonded connections to pins on the integrated circuit, or connected to the backplate 3, or sometimes to both of these.

In accordance with the present invention, the capacitors 8 through 10 are supported, at least over their insulated portion, by bridging portions of the backplate 3 which run beneath the board apertures. These may be seen more clearly by reference to FIG. 2 of the drawing. A pair of plate apertures 45, 46 are separated by a bridging portion 47 which serves to support capacitor 6. A turned-up tab 48 extending upward approximately the thickness of the printed circuit board above is formed in the backplate.

A plate aperture 49 and a plate aperture 50 are separated by a bridging portion 51 also having an upstanding tab 52, for supporting capacitor 7.

An aperture 53 is located adjacent a bridging portion 54 and a tab 55. The space beyond the edge 56 of plate 3 serves the same purpose as an aperture. Bridging portion 54 supports the proximal pair of terminals of end-to end capacitors 8 and 9, while the distal pair of terminals overhang the backplate on one side or aperture 53 on the other side.

A plate aperture 57 is located adjacent a bridging portion 58 which supports capacitor 10. The foregoing backplate apertures are of sufficient size to clear the uninsulated end terminals of the capacitors unless, as in the case of capacitors 6, 7, 8 and 9, selected terminals are intended to be also connected to the backplate.

The backplate is secured to the board by soldered connections using turned up tabs. Further details of the backplate shown in FIG. 2 include an upstanding tab 59 for retaining the backplate to the board, an upstanding tab 60 serving the same purpose and also as a ground connection for the switch. Other extensions for making electrical contact include an extending spring finger 61 located in the battery aperture 32 (FIG. 1), so as to contact the button cell, and a finger 62 serving as an internal flexible switch member.

Returning to FIG. 1, the plate tab 59 is located in a board aperture 63 and soldered to a pad 64. Tab 60 is similarly located in a board aperture 65 and soldered to a pad 66. A flexible switching member 67 which is part of the aforementioned crown setting switch is also connected by soldering to pad 66.

A conductive clip 68 soldered to a track 69 is arranged to cooperate with the flexible switching member 62.

Figure 3:
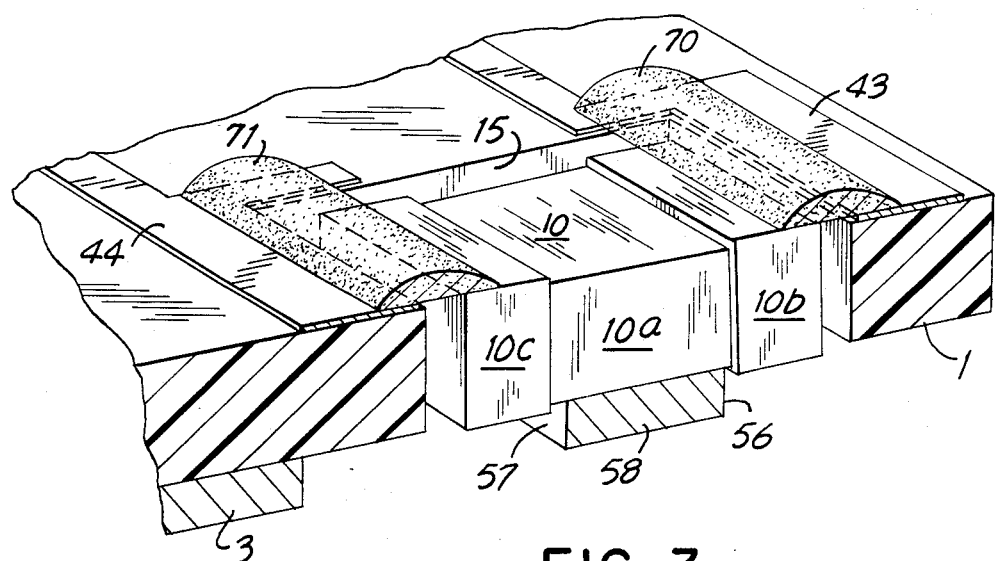
Figure 4:
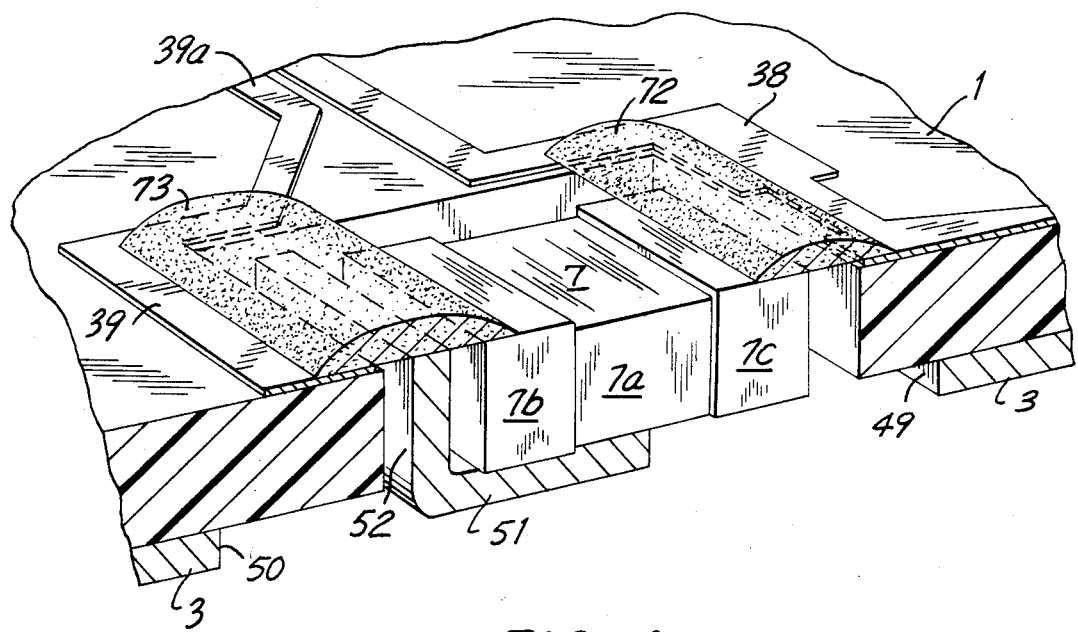

Referring now to FIGS. 3 and 4 of the drawing, two types of connections to the capacitors are shown as representative of the inventive concept. One type of connection, shown in FIG. 3, is representative of the connection used for capacitor 10, while FIG. 4 is representative of the type of connection used for capacitor 7.

Figure 2:
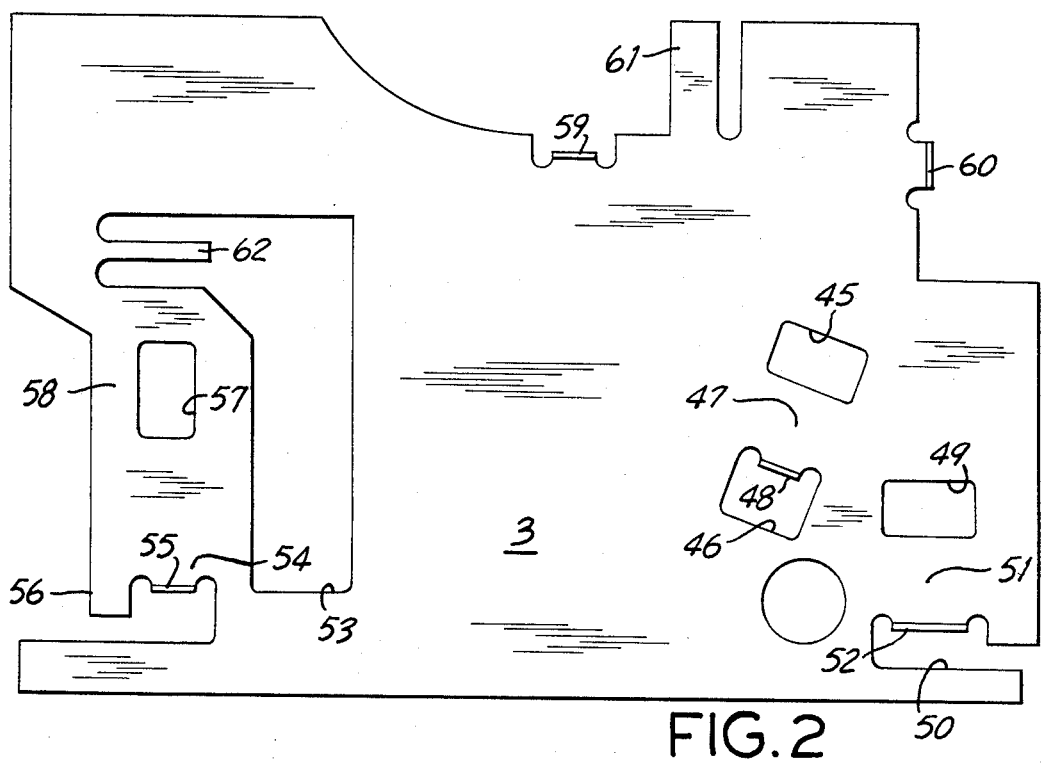

Referring first to FIG. 3 of the drawing, reference numerals are used which correspond to those used in FIGS. 1 and 2. Capacitor 10 is located in board aperture 15 in the printed circuit board 1, which is shaped to properly locate and accommodate the capacitor. Capacitor 10 has a central insulated portion 10a and conductive end terminals 10b, 10c. Aperture 57 in the backplate 3 is shaped and located so as to avoid or clear the terminal 10c. The open space beyond the side edge 56 of the backplate serves also in the manner of an aperture and clears or avoids contact with terminal 10b. The insulated portion 10a of the capacitor is supported on the backplate bridging portion 58. The capacitor thickness is substantially that of PCB 1, so that terminals 10b, 10c are at the same level as, and adjacent to the conductive pads 43, 44. Solder connections 70, 71 connect the terminals to the adjacent pads.

Referring to FIG. 4 of the drawing, a type of connection is shown in which one end of the capacitor is connected to the grounded backplate 3. Capacitor 7 includes an insulating portion 7a and conductive end terminals 7b, 7c. Terminal 7c is located with respect to aperture 49 in the backplate 3 so that no contact is made. In aperture 50, tab 52 is turned up by a length approximately equal to the thickness of the printed circuit board to terminate at its upper surface. The insulated portion 7a and the conductive portion 7b are both supported on the bridging portion 51 of the backplate. A solder connection 72 connects capacitor terminal 7c to pad 38. A solder connection 73 connects tab 52 to the terminal 7b of the capacitor to place it at ground potential. Solder connection 73 also connects the capacitor terminal to pad 39. A track 39a also leads to an integrated circuit pin, as a convenient way to connect the pin also to ground potential.

Integrated circuit 4 is also supported by the backplate 3 and attached to it by conductive epoxy, which also electrically grounds the unencapsulated circuit substrate. Since the entire underside of the integrated circuit is supported, there is no need for plate apertures in this case. However the thickness of the integrated circuit is substantially equal to the thickness of PCB 1 so that the wire bond connections are made substantially at the upper surface of the PCB.

Figure 5:
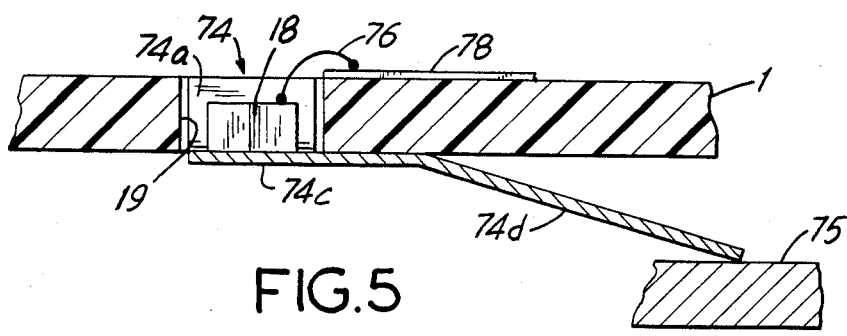
Figure 6:
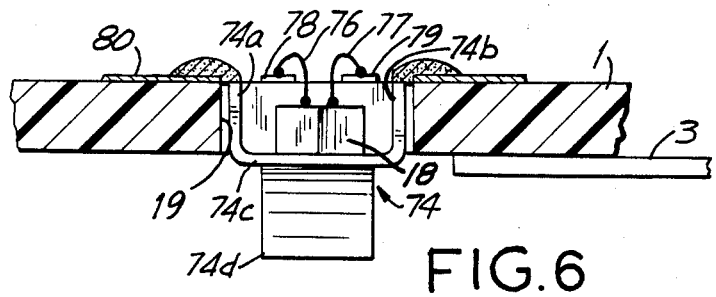

The construction is adaptable to supporting and connecting other discrete components within locating apertures in the printed circuit board. FIGS. 5 and 6 show the details of connecting the alarm transistor 18 to the PCB and to other watch elements. A thin conductive metal clip, shown generally as 74, comprises a pair of bent up tabs 74a, 74b connected by a bridging portion 74c. The bridging portion is integrally connected with a spring contact finger 74d extending below the PCB 1 and backplate 3. The finger is adapted to electrically engage another timepiece member requiring electrical connection, such as piezoelectric watch alarm device 75. The metal clip 74 is positioned within the backplate aperture 53 so that it does not contact the backplate.

Transistor 18 is initially in unencapsulated form with the silicon substrate underside acting as the collector terminal which makes electrical contact with and is supported by the bridging portion 74c of the clip. The transistor substrate is bonded to the clip with conductive epoxy. Transistor 18 also has a pair of upper connection terminals for its base and emitter, which are connected by wirebonded leads 76, 77 to conductive tracks 78, 79 on the PCB. The tabs 74a, 74b are soldered to the conductive pads, such as 80 surrounding the board aperture 19. As shown in FIG. 1, pad 80 is connected by a lead to alarm inductor 17.

Clip 74 supporting the transistor 18 and clip 33 supporting the energy cell are electrically isolated from the conductive backplate. However, they have bridging portions supporting the components, are attached to the board by tabs and provide electrical connection to the supported components in much the same manner as the backplate.

Thus there has been described an improved electronic circuit board for a timepiece, wherein the discrete circuit components are supported by a conductive backplate in board apertures with the connections made substantially at the upper surface of the PCB to provide a very thin circuit board. Assembly of the components is extremely simple. The capacitors and other discrete components are simply placed into the board apertures where they are located in the proper position and supported by the backplate or clip, while solder connections made at opposite ends to the conductive pads without further preparation. If desired, either or both sides of the electronic circuit board can lastly be protected by suitable insulated coatings. The transistor and integrated circuit may be encapsulated by depositing encapsulating material in the board aperture on top of them.

The thickness of the discrete components, integrated circuit and transistor may vary somewhat according to manufacturer. The term substantially the same thickness as the insulating board includes some variation to still lie within the scope of the present invention. For example, transistor 18 is commercially available in sizes varying between 0.01 and 0.02 inches, and the insulation board is preferably 0.016 inches. Transistor 18 is depicted in FIGS. 5 and 6 as being a somewhat lesser thickness than the board to illustrate these variations.

While there has been described what is considered to be the preferred embodiment of the invention, other modifications will occur to those skilled in the art, and it is desired to secure in the appended claims all such modifications as fall within the true spirt and scope of the invention.

We claim:

1. An electronic circuit board for a timepiece comprising:
   a board of insulating material defining a plurality of board apertures therein, and having a plurality of conductive pads located adjacent said board apertures,
   a plurality of discrete components each having an insulated portion and a plurality of spaced conductive terminals disposed in a plane parallel to said board, said components having a thickness substantially that of the board thickness,
   a thin conductive backplate secured to said board on the side thereof opposite said conductive pads, having backplate apertures therein and having bridging portions adjacent said backplate apertures,
   said board apertures being shaped to accommodate and locate said components,
   said backplate apertures being shaped and located to avoid at least some of the component conductive terminal portions,
   said bridging portions being beneath said board apertures and being shaped and located to support said components, and
   said conductive terminal portions of the components being connected to selected ones of said conductive pads.

2. The combination according to claim 1, wherein at least one of said discrete components is a leadless capacitor having opposite conductive terminal ends, wherein at least one of said bridging portions is between a pair of backplate apertures and supporting only the insulating portion of said capacitor, and wherein said opposite terminal ends of the capacitor are connected to a pair of said conductive pads.

3. The combination according to claim 1, wherein at least one of said discrete components is a leadless capacitor having opposite conductive terminal ends, wherein at least one of said bridging portions is beneath a pair of backplate apertures, wherein said backplate defines a tab turned up adjacent one of said backplate apertures into said board aperture for a distance substantially equal to the board thickness, and wherein one said terminal end of the capacitor is connected to one of said conductive pads and the other said terminal end is connected to said tab.

4. The combination according to claim 3, wherein said tab-connected terminal end is also connected to another of said conductive pads.

5. The combination according to claim 1, wherein at least a pair of said discrete components are leadless capacitors having opposite conductive terminal ends and disposed end-to-end in the same board aperture to provide a distal pair and a proximal pair of terminals, wherein said backplate defines a bridging portion beneath the proximal pair and defines also a tab turned up adjacent the proximal pair of capacitor terminals, and wherein the proximal pair are connected to said tab and each terminal of the distal pair is connected to respective ones of said conductive pads.

6. The combination according to claim 1, wherein at least one of said discrete components is a leadless capacitor having opposite conductive terminal ends, wherein said bridging portion is between a backplate aperture and the edge of the backplate, and wherein opposite terminal ends of the capacitor are connected to a pair of said conductive pads.

7. The combination according to claim 1, and further including an integrated circuit having one side thereof supported on and electrically connected to the backplate, and having a plurality of terminals on the other side thereof connected to a plurality of said conductive pads.

8. The combination according to claim 1 and further including a conductive spring clip disposed beneath said board and having a pair of turned-up tabs soldered at their ends to said board conductive pads and having a bridging portion beneath a board aperture adapted to electrically contact and support an additional component within said board aperture.

9. The combination according to claim 8, wherein said backplate defines a resilient finger terminating adjacent said bridging portion and adapted to cooperate with the bridging portion to contact the terminals of an energy cell for the timepiece.

10. The combination according to claim 8, wherein said additional component is a transistor having one side thereof supported by and electrically connected to said spring clip, said transistor having a plurality of upper contact terminals on the other side thereof connected to a plurality of additional conductive pads on said board.

11. The combination according to claim 8, wherein said clip further includes a spring contact finger extending below said board and adapted to electrically and resiliently contact another component of the timepiece.

12. The combination according to claim 1, wherein said conductive terminal portions are connected by soldering to said conductive pads at substantially the surface of said board opposite the backplate.

13. The combination according to claim 1, wherein said backplate defines a tab turned up through a said board aperture, and wherein said tab is soldered to a conductive pad to hold said backplate to said board.

* * * * *